(12) United States Patent
Onodera

(10) Patent No.: US 12,727,434 B2
(45) Date of Patent: Sep. 1, 2026

(54) WORKPIECE ATTRACTION DEVICE

(71) Applicant: CREATIVE TECHNOLOGY CORPORATION, Kawasaki (JP)

(72) Inventor: Hiromitsu Onodera, Kawasaki (JP)

(73) Assignee: CREATIVE TECHNOLOGY CORPORATION, Kawasaki (JP)

( * ) Notice: Subject to any disclaimer, the term of this patent is extended or adjusted under 35 U.S.C. 154(b) by 168 days.

(21) Appl. No.: 18/842,217

(22) PCT Filed: Mar. 24, 2023

(86) PCT No.: PCT/JP2023/012000
§ 371 (c)(1),
(2) Date: Aug. 28, 2024

(87) PCT Pub. No.: WO2023/190247
PCT Pub. Date: Oct. 5, 2023

(65) Prior Publication Data

US 2025/0167029 A1 May 22, 2025

(30) Foreign Application Priority Data

Mar. 29, 2022 (JP) ................................ 2022-053021

(51) Int. Cl.
*H10P 72/72* (2026.01)

(52) U.S. Cl.
CPC .................................. *H10P 72/722* (2026.01)

(58) Field of Classification Search
CPC ......... H10P 72/722; B65H 29/00; H01G 7/02; B25J 15/0085; H02N 13/00
(Continued)

(56) References Cited

U.S. PATENT DOCUMENTS 12,100,610 B2 * 9/2024 Sasaki .................. H10P 72/722
12,125,731 B2 * 10/2024 Ono ...................... H10P 72/722
(Continued)

FOREIGN PATENT DOCUMENTS

JP 58-207230 A 12/1983
JP 11-330217 A 11/1999
JP 2007-45618 A 2/2007

OTHER PUBLICATIONS

Hidemasa Araya, Title: Carrying Device using electrostatic attraction plate, Entire specification and drawings (Year: 2007).*
(Continued)

*Primary Examiner* — Dharti H Patel
(74) *Attorney, Agent, or Firm* — Birch, Stewart, Kolasch & Birch, LLP

(57) ABSTRACT

A workpiece attraction device is provided that can dechuck (separate) the attracted workpiece in a short time and reliably even when transporting thin workpieces such as paper, cloth, or resin films. A workpiece attraction device includes: an electrostatic attraction body (1) capable of attracting a workpiece (W) to a workpiece attraction surface (1*a*) by applying a voltage to an attraction electrode (4*a*, 4*b*); and a workpiece separation body (5) that is interposed between an attracted workpiece and the electrostatic attraction body, and assists in separating the workpiece from the workpiece attraction surface after application of voltage to the attraction electrode is stopped. In the workpiece attraction device, the workpiece separation body has a plurality of opening portions (6) for applying a workpiece attraction force, generated on the workpiece attraction surface, toward a workpiece, the workpiece separation body is partitioned into the opening portions by a lattice portion (7) so that the opening portions are substantially uniformly present within a plane of the workpiece separation body, and in a plan view from a workpiece side with a workpiece attracted, the attraction
(Continued)

electrode of the electrostatic attraction body does not face the lattice portion of the workpiece separation body.

8 Claims, 10 Drawing Sheets

(58) Field of Classification Search
USPC .......................................................... 361/234
See application file for complete search history.

(56) References Cited

U.S. PATENT DOCUMENTS

| | | | | |
|---|---|---|---|---|
| 12,322,634 | B2 * | 6/2025 | Venkatraman | B33Y 10/00 |
| 12,456,640 | B2 * | 10/2025 | Fujita | H10P 72/72 |
| 12,500,110 | B2 * | 12/2025 | Park | H10P 72/722 |
| 12,512,358 | B2 * | 12/2025 | Chadha | H10P 72/722 |
| 2010/0133070 | A1 | 6/2010 | Araie et al. | |
| 2012/0262834 | A1 | 10/2012 | Eytan et al. | |
| 2025/0167029 | A1 * | 5/2025 | Onodera | B25J 15/0085 |

OTHER PUBLICATIONS

International Search Report for PCT/JP2023/012000 (PCT/ISA/210) mailed on Jun. 13, 2023.
Written Opinion of the International Searching Authority for PCT/JP2023/012000 (PCT/ISA/237) mailed on Jun. 13, 2023.

* cited by examiner

WORKPIECE ATTRACTION DEVICE

TECHNICAL FIELD

The present invention relates to a workpiece attraction device including an electrostatic attraction body that attracts a workpiece to a workpiece attraction surface, and a workpiece separation body that assists in separating the workpiece from the workpiece attraction surface after the attraction of the workpiece. More specifically, the present invention relates to a workpiece attraction device that can separate a workpiece in a short time and reliably from the workpiece attraction surface when dechucking the workpiece from the workpiece attraction surface.

BACKGROUND ART

When a voltage is applied to an electrostatic attraction body having an attraction electrode therein to attract a workpiece, and the workpiece is then separated from the workpiece attraction surface, a phenomenon in which residual charge prevents the workpiece from being properly separated (dechucked) often occurs. These phenomena occur depending on the type of workpiece, and are particularly significant with soft and thin workpieces such as paper, cloth, and resin films.

For example, when an electrostatic attraction body is attached to a robot hand side to transport a workpiece, such dechucking failure will cause a transportation failure, such as the workpiece being misaligned when being separated at the destination, or the workpiece being taken back to the original position. It may be effective to wait until the effect of the residual charge decreases after the voltage application is stopped to prevent the workpiece from being misaligned. However, this increases the cycle time from workpiece attraction to separation.

In view of that, a method of applying a reverse voltage in dechucking a workpiece is known (see, for example, Patent Literature 1). In other words, a reverse voltage is applied that has the polarity opposite to that used in electrostatically attracting the workpiece to the electrostatic attraction body, and thereby the residual charge is reduced, enabling the workpiece to be separated smoothly.

However, this method is susceptible to influence of the workpiece, and the reverse voltage to be applied varies depending on the material, physical properties, and surface conditions of the workpiece being transported, or the surrounding environment. This makes it difficult to actually eliminate the above-described transportation failures, and the like.

In an example in which a charged plate is used that is charged by friction with a charging brush, a method is known that includes: providing a shutter, which can be opened and closed, between the charged plate and an adhesion plate for causing a workpiece to adhere to the lower surface thereof; and closing the shutter to block the adhesion force of the charged plate, in separating (dropping) the workpiece adhering to the lower surface of the adhesion plate (see Patent Literature 2).

Furthermore, a transportation device is known that transports a handling target (workpiece) by attracting it to an electrostatic attraction plate having an electrode portion therein (see Patent Literature 3). The transportation device is provided with a release plate having an opening portion between the electrostatic attraction plate and the workpiece. The transportation device brings the release plate into close contact with the electrostatic attraction plate when attracting the workpiece, and the device separates the release plate from the electrostatic attraction plate when releasing (separating) the workpiece. Thereby, the transportation device can reduce the electrostatic attraction force (workpiece attraction force) applied from the electrostatic attraction plate to the workpiece.

These methods employ direct means to block or eliminate the attraction force on the workpiece in dechucking. Therefore, although they exhibit effects to some extent, repeated use causes the workpieces to adhere to the adhesion plate (Patent Literature 2) or release plate (Patent Literature 3). This still hinders separation of the workpieces.

CITATION LIST

Patent Literature

Patent Literature 1: JPH11-330217 A
Patent Literature 2: JPS58-207230 A
Patent Literature 3: JP2007-45618 A

SUMMARY OF INVENTION

Technical Problem

As in the above-described examples, in various manners of transportation, in which a robot hand to which an electrostatic attraction body is attached to pick up workpieces or move them between locations is used, the cycle time from attraction to separation of the workpiece is lengthened and thereby productivity is reduced unless the dechucking (separation) of the workpiece can be performed accurately in a short time. However, in transportation of thin workpieces such as paper, cloth, and resin films, the workpieces are particularly susceptible to the effect of residual charge, making it extremely difficult to eliminate the above-described transportation failure.

In this circumstance, the inventors have conducted extensive research into methods for preventing the effect of residual charge, and as a result, have made findings, which have led to the completion of the present invention, on a workpiece attraction device, the workpiece attraction device having a workpiece separation body, interposed between a workpiece and the electrostatic attraction body, to be able to assist in separation of the workpiece from the electrostatic attraction body after the attraction of the workpiece, the electrostatic attraction body having an attraction electrode therein to attract the workpiece. The findings indicate that the above-described failure can be eliminated by using a workpiece attraction device that prevents the workpiece separation body from dielectric polarization or electrostatic induction when attracting the workpiece.

Therefore, an object of the present invention is to provide a workpiece attraction device that can dechuck (separate) an attracted workpiece in a short time and reliably even when transporting thin workpieces such as paper, cloth, or resin films.

Solution to Problem

The gist of the present invention is as follows.

(1) A workpiece attraction device, including:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, and in a plan view from a workpiece side with a workpiece attracted, the attraction electrode of the electrostatic attraction body does not face the lattice portion of the workpiece separation body.

(2) The workpiece attraction device according to (1), wherein the lattice portion of the workpiece separation body is disposed so as to surround the attraction electrode of the electrostatic attraction body, and in a plan view from a workpiece side with a workpiece attracted, the attraction electrode of the electrostatic attraction body does not face the lattice portion of the workpiece separation body.

(3) A workpiece attraction device, including:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, and a conductive shielding member is interposed between the lattice portion of the workpiece separation body and the attraction electrode of the electrostatic attraction body.

(4) The workpiece attraction device according to (3), wherein the conductive shielding member is disposed on the electrostatic attraction body.

(5) A workpiece attraction device, including:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, in a plan view from a workpiece side with a workpiece attracted, the attraction electrode of the electrostatic attraction body does not face the lattice portion of the workpiece separation body, and a conductive shielding member is interposed between the lattice portion of the workpiece separation body and the attraction electrode of the electrostatic attraction body.

(6) The workpiece attraction device according to any of (3) to (5), wherein the conductive shielding member is connected to an earth.

Advantageous Effects of Invention

The workpiece attraction device of the present invention allows dechucking (separating) the attracted workpiece in a short time and reliably even when transporting thin workpieces such as paper, cloth, and resin films. In particular, the present invention can provide a workpiece attraction device that: prevents the workpiece separation body from dielectric polarization or electrostatic induction when attracting the workpiece; is therefore less susceptible to the influence of the type and shape of the workpiece or to the surrounding environment such as humidity; and is allowed to be versatile.

DESCRIPTION OF EMBODIMENTS

Figure 1A:
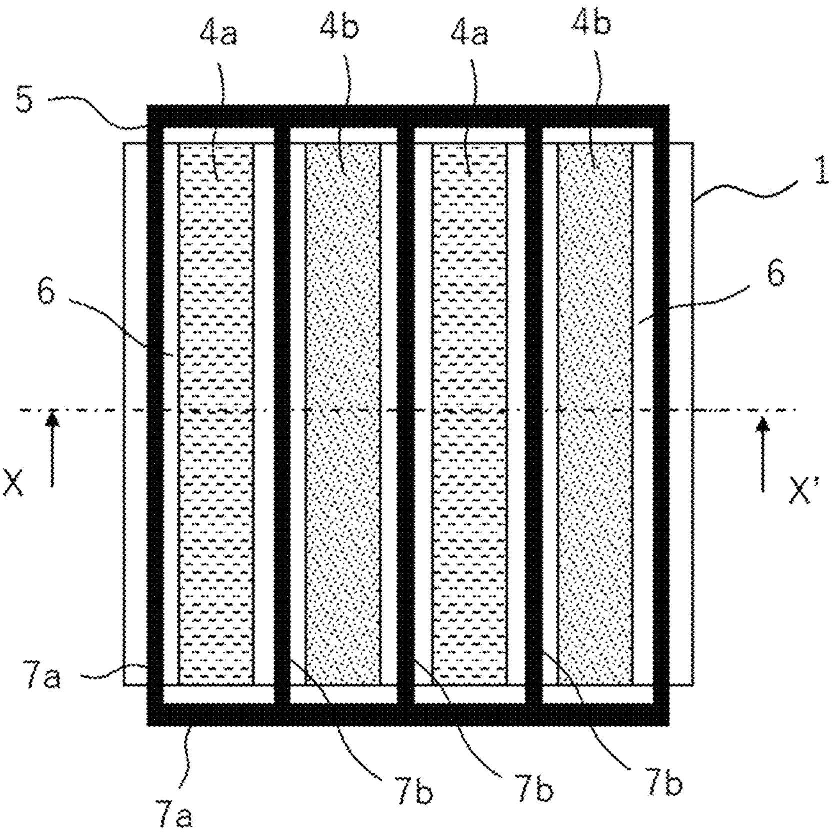
FIG. 1 is a diagram for describing an example of a workpiece attraction device in the present invention, in which FIG. 1(*a*) shows a plan view and FIG. 1(*b*) shows an X-X' cross-sectional view in FIG. 1(*a*).

The present invention will be described in detail below.

The present invention is a workpiece attraction device, including: an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped. The workpiece attraction device is designed to: prevent the workpiece separation body from dielectric polarization or electrostatic induction when applying a voltage to the attraction electrode to attract the workpiece; and eliminate the influence of residual charge, as much as possible, that remains after stopping the application of voltage to the attraction electrode.

Specifically, the workpiece separation body has a plurality of opening portions for applying the workpiece attraction force, generated on the workpiece attraction surface, toward the workpiece, and the workpiece separation body is partitioned into the opening portions by a lattice portion so that these opening portions are substantially uniformly present within a plane of the workpiece separation body. This prevents the lattice portion of the workpiece separation body from dielectric polarization or electrostatic induction when a voltage is applied to the attraction electrode. In order to prevent the lattice portion of the workpiece separation body from dielectric polarization or electrostatic induction, the present invention can specifically show the following embodiments. Depending on the material that constitutes the lattice portion of the workpiece separation body, either dielectric polarization or electrostatic induction can be used. However, in short, the present invention is designed so that a bias in charge does not occur in the lattice portion of the workpiece separation body when a voltage is applied to the attraction electrode to attract the workpiece, and charge is not generated on the surface of the lattice portion, thereby eliminating residual charge as much as possible.

First, a first embodiment is a workpiece attraction device having the attraction electrode of the electrostatic attraction body that does not face the lattice portion of the workpiece separation body, in a plan view from a workpiece side with a workpiece attracted.

Here, a plan view from a workpiece side with a workpiece attracted means a plan view from the workpiece side in a state in which the workpiece is attracted to the electrostatic attraction body, that is, in a state in which: a workpiece attraction force acts between the workpiece and the electrostatic attraction body; the workpiece is attracted to the electrostatic attraction body; and a workpiece separation body is interposed between the workpiece and the electrostatic attraction body in close contact with both. The plan view shows the relative positional relationship, in the state, between the attraction electrode of the electrostatic attraction body and the lattice portion of the workpiece separation body. In other words, when the attraction electrode of the electrostatic attraction body and the lattice portion of the workpiece separation body are projected onto the workpiece attraction surface, they are positioned so as not to overlap with each other. Specifically, examples of such a workpiece attraction device can include a device having a lattice portion of a workpiece separation body disposed so as to surround an attraction electrode of an electrostatic attraction body.

Figure 1B:
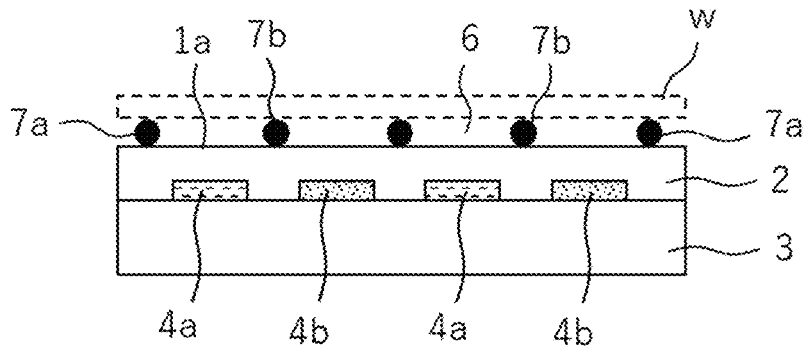

FIG. 1 shows a specific example of this. In this example, the electrostatic attraction body 1 is provided with a bipolar attraction electrode 4 consisting of an attraction electrode 4*a* to which a positive voltage is applied and an attraction electrode 4*b* to which a negative voltage is applied. The workpiece separation body 5 has a plurality of opening portions 6 for applying the workpiece attraction force, generated on the workpiece attraction surface 1*a* of the electrostatic attraction body 1, to the workpiece w. The workpiece separation body 5 is partitioned into opening portions 6 by a lattice portion 7 so that opening portions 6 are substantially uniformly present within the plane of the workpiece separation body 5.

In FIG. 1, the lattice portion 7 is formed by frame bodies 7*a* and a plurality of connecting portions 7*b* that connect the inside of the frame bodies 7*a* in the vertical direction. Of them, the connecting portions 7*b* extend in the length direction of the attraction electrodes 4*a* and 4*b*. In a plan view seen from the workpiece w side with a workpiece attracted, the connecting portions 7*b* are each at a position corresponding to the gap between the adjacent attraction electrodes 4*a* and 4*b*. The frame bodies 7*a* are positioned outside the whole attraction electrode 4 consisting of the attraction electrodes 4*a* and 4*b*.

As a result, the lattice portion 7 of the workpiece separation body 5 is disposed so as to surround the attraction electrode 4 of the electrostatic attraction body 1. Furthermore, the frame bodies 7*a* and connecting portions 7*b* do not overlap the attraction electrode 4 of the electrostatic attraction body 1 in the thickness direction of the workpiece attraction device, and in addition, the attraction electrode 4 of the electrostatic attraction body 1 do not face the lattice portion 7 of the workpiece separation body 5. Accordingly, when a voltage is applied to the attraction electrode, the lattice portion 7 of the workpiece separation body 5 is not directly above the attraction electrode 4 (4*a*, 4*b*). This prevents the lattice portion 7 of the workpiece separation body 5 from dielectric polarization or electrostatic induction. Therefore, even if the workpiece w is repeatedly attracted and separated (detached), no residual charge is accumulated. This can prevent the workpiece w from adhering to the workpiece separation body 5.

Next, a second embodiment can include a workpiece attraction device in which a conductive shielding member is interposed between a lattice portion of a workpiece separation body and an attraction electrode of an electrostatic attraction body.

Figure 2A:
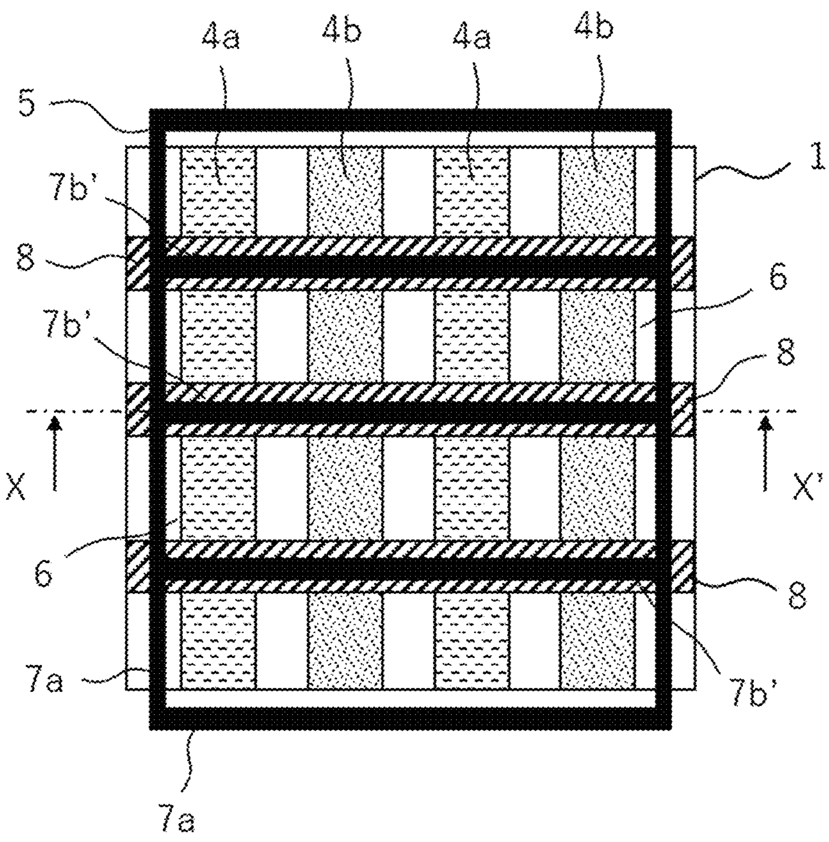
FIG. 2 is a diagram for describing another example of the workpiece attraction device in the present invention, in which FIG. 2(*a*) shows a plan view and FIG. 2(*b*) shows an X-X' cross-sectional view in FIG. 2(*a*).
Figure 2B:
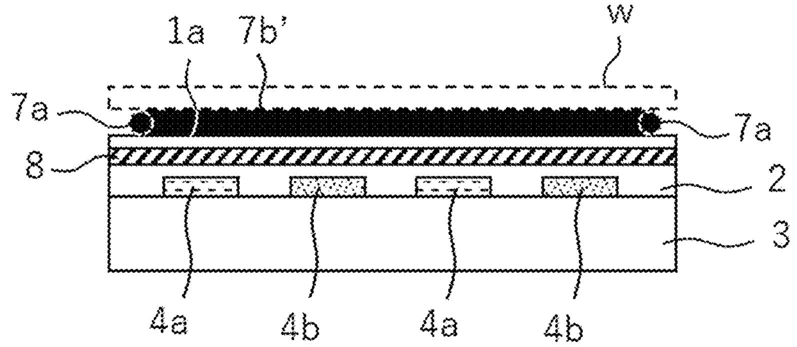

FIG. 2 shows a specific example of the second embodiment. The electrostatic attraction body 1 in this example is provided with bipolar attraction electrodes 4*a* and 4*b*, similarly to the case of FIG. 1. The workpiece separation body 5 is provided with the opening portions 6 and the lattice portion 7 as in the case of FIG. 1. However, connecting portions 7*b*' forming the lattice portion 7 connect the inside of the frame bodies 7*a* in the horizontal direction, and the connecting portions 7*b*' cross the attraction electrodes 4*a* and 4*b*.

In the second embodiment, conductive shielding members 8 are interposed between the connecting portions 7*b*' and the attraction electrodes 4*a* and 4*b* in the corresponding portions where the connecting portions 7*b*' cross the attraction electrodes 4*a* and 4*b*. Accordingly, the lattice portion 7 of the workpiece separation body 5 is not directly above the attraction electrode 4 (4*a*, 4*b*). This prevents the lattice portion 7 of the workpiece separation body 5 from dielectric polarization or electrostatic induction when a voltage is applied to the attraction electrode 4. This can then prevent the workpiece w from adhering to the workpiece separation body 5 as in the case of the first embodiment. The conductive shielding members 8 are preferably disposed on the electrostatic attraction body 1. In the plan view shown in FIG. 2(*a*), even if residual charge occurs on the workpiece w at boundaries between the conductive shielding members 8 and the attraction electrodes 4*a* (or the attraction electrodes 4*b*), the conductive shielding members 8 are left behind on the side of the electrostatic attraction body 1 when the workpiece separation body 5 separates from the workpiece attraction surface 1*a* of the electrostatic attraction body 1 to dechuck the workpiece w. This makes it possible to prevent the residual charge of the workpiece w from acting on the workpiece separation body 5 to cause the workpiece to adhere thereto. When the conductive shielding members 8 are provided on the electrostatic attraction body 1, they may be disposed on the workpiece attraction surface 1*a* of the electrostatic attraction body 1, or they may be embedded inside the electrostatic attraction body 1.

In the present invention, specific examples of the first and second embodiments described above can be illustrated, in order to prevent dielectric polarization or electrostatic induction in the lattice portion of the workpiece separation body when a voltage is applied to the attraction electrode. However, these can be modified or combined as appropriate.

Figure 3A:
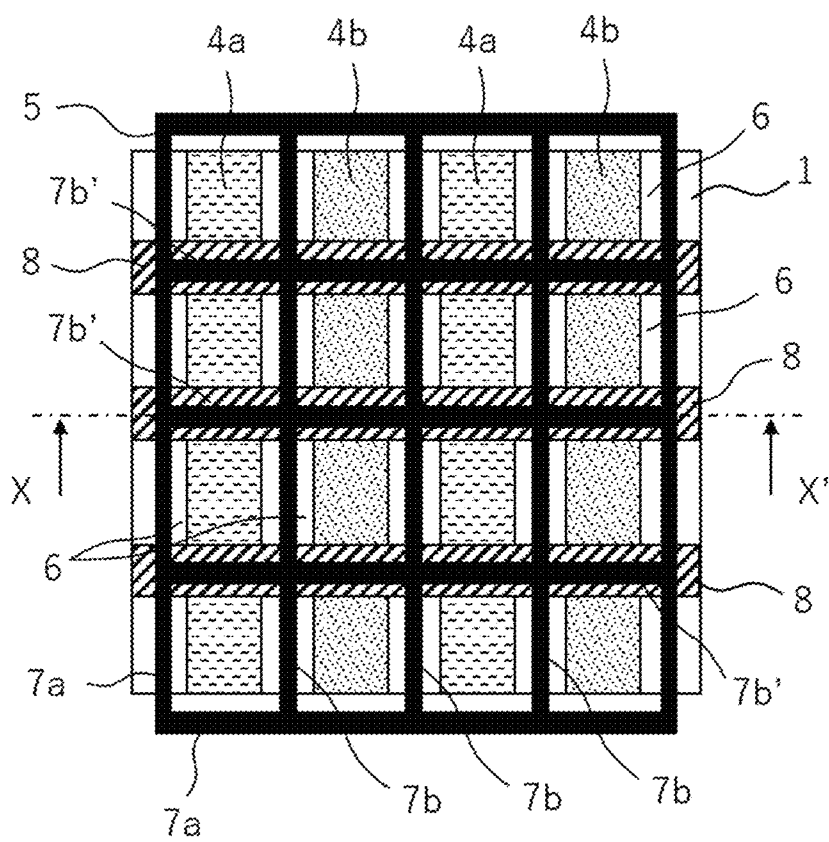
FIG. 3 is a diagram for describing still another example of the workpiece attraction device in the present invention, in which FIG. 3(*a*) shows a plan view and FIG. 3(*b*) shows an X-X' cross-sectional view in FIG. 3(*a*).
Figure 3B:
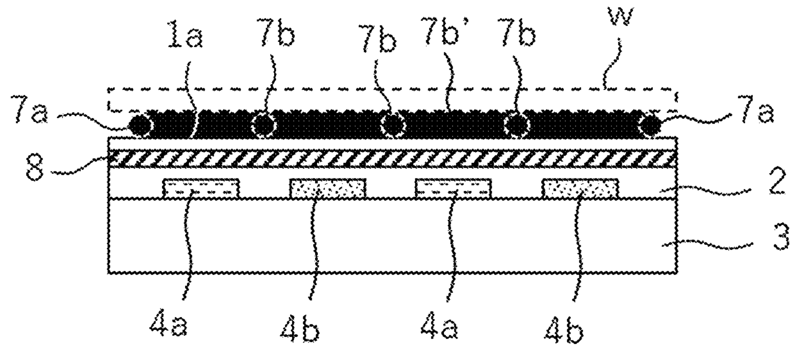

For example, FIG. 3 shows a workpiece attraction device according to a third embodiment in which the first embodiment and the second embodiment are combined. In this example, the connecting portions 7*b* forming the lattice portion 7 of the workpiece separation body 5 are located at positions corresponding to the gaps between the adjacent attraction electrodes 4*a* and 4*b*. The frame bodies 7*a* are positioned outside the whole attraction electrode 4 consisting of the attraction electrodes 4*a* and 4*b*. The connecting portions 7*b* and the frame bodies 7*a* do not overlap the attraction electrode 4 of the electrostatic attraction body 1 in the thickness direction of the workpiece attraction device. In addition, there are the conductive shielding members 8 interposed between: the attraction electrodes 4*a* and 4*b*; and the connecting portions 7*b*' provided in a direction crossing the attraction electrodes 4*a* and 4*b*. This prevents the lattice portion 7 of the workpiece separation body 5 from dielectric polarization or electrostatic induction when a voltage is applied to the attraction electrode 4.

Figure 4A:
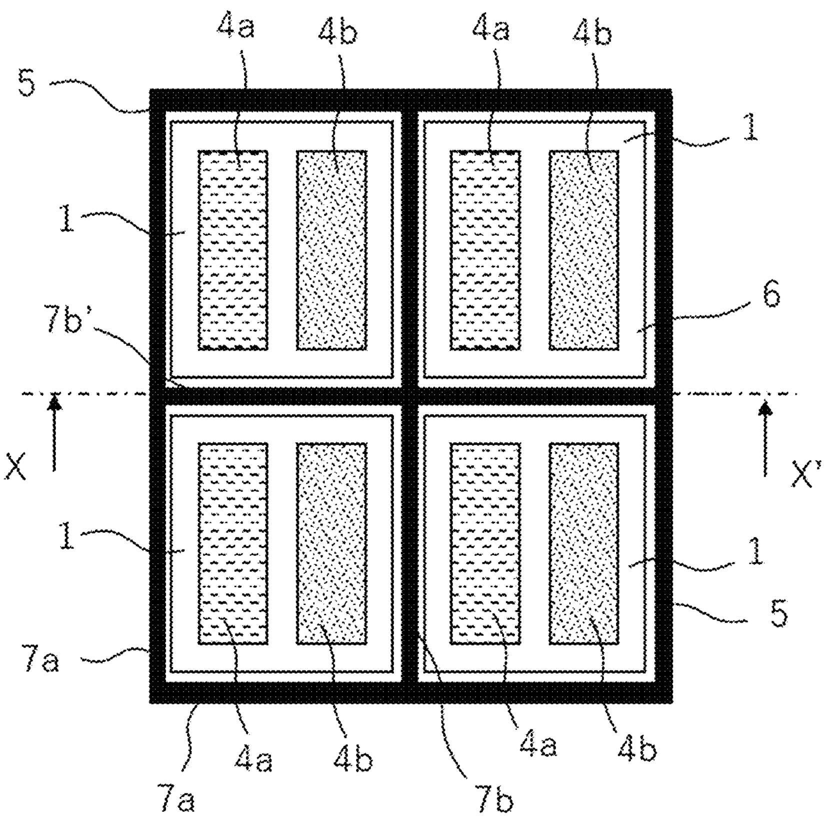
FIG. 4 is a diagram for describing still another example of the workpiece attraction device in the present invention, in which FIG. 4(*a*) shows a plan view and FIG. 4(*b*) shows an X-X' cross-sectional view in FIG. 4(*a*).
Figure 4B:
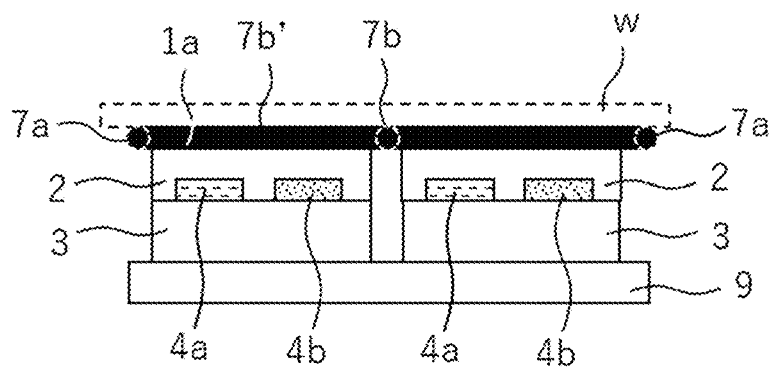

FIG. 4 shows a workpiece attraction device according to a fourth embodiment, which is a modified example of the first embodiment. In this example, a plurality of electrostatic attraction bodies 1 (four in FIG. 4) are disposed on a support material 9, each electrostatic attraction body 1 having an attraction electrode 4 (4*a*, 4*b*) therein. The lattice portion 7 of the workpiece separation body 5 is formed of frame bodies 7*a*, connecting portions 7*b* that connect the inside of the frame bodies 7*a* in the vertical direction, and connecting portions 7*b*' that connect the inside of the frame bodies 7*a* in the horizontal direction. The lattice portion 7 of the workpiece separation body 5, which is formed of the frame bodies 7*a* and the connecting portions 7*b* and 7*b*', is disposed so as to surround the attraction electrodes 4 (4*a*, 4*b*) of the electrostatic attraction bodies 1. The frame bodies 7*a* and connecting portions 7*b* and 7*b*' do not overlap the attraction electrodes 4 of the electrostatic attraction bodies 1 in the thickness direction of the workpiece attraction device. In addition, each attraction electrode 4 of the electrostatic attraction body 1 does not face the lattice portion 7 of the workpiece separation body 5.

As described above, the workpiece separation body in the present invention has a plurality of opening portions for applying the workpiece attraction force, generated on the workpiece attraction surface, toward the workpiece. The workpiece separation body is partitioned into these opening portions by the lattice portion so that they are substantially uniformly present within the plane of the workpiece separation body. In the above example, the lattice portion of the workpiece separation body is formed of the frame bodies and the connecting portions that connect the inside of the frame bodies in the vertical direction and the connecting portions that connect the inside of the frame bodies in the horizontal direction. However, for example, the lattice portion may be formed of only connecting portions crossing in the vertical and horizontal directions, without frame bodies. The angle at which the connecting portions cross may be set to any angle other than 90 degrees so that the connecting portions cross obliquely. The lattice portion of the workpiece separation body can be designed and formed as appropriate depending on the shape of the attraction electrode in the electrostatic attraction body, the size of the workpiece and the workpiece attraction surface, etc. The same applies to the opening portions of the workpiece separation body.

Figure 5A:
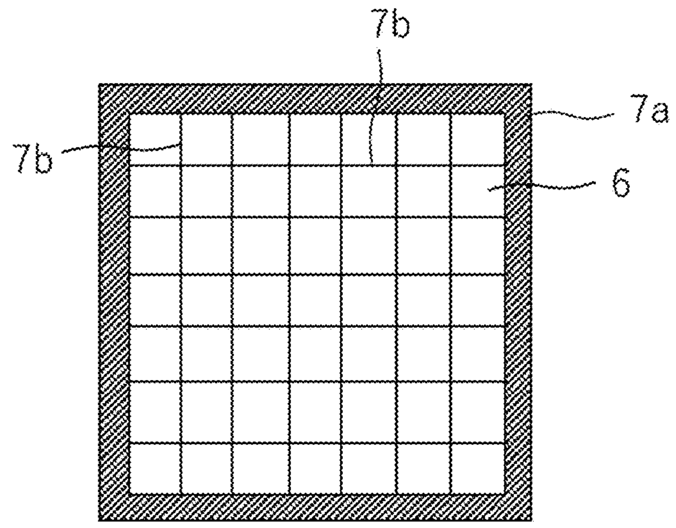
FIG. 5(*a*) and FIG. 5(*b*) are plan views each showing an example of a lattice portion of a workpiece separation body.
Figure 5B:
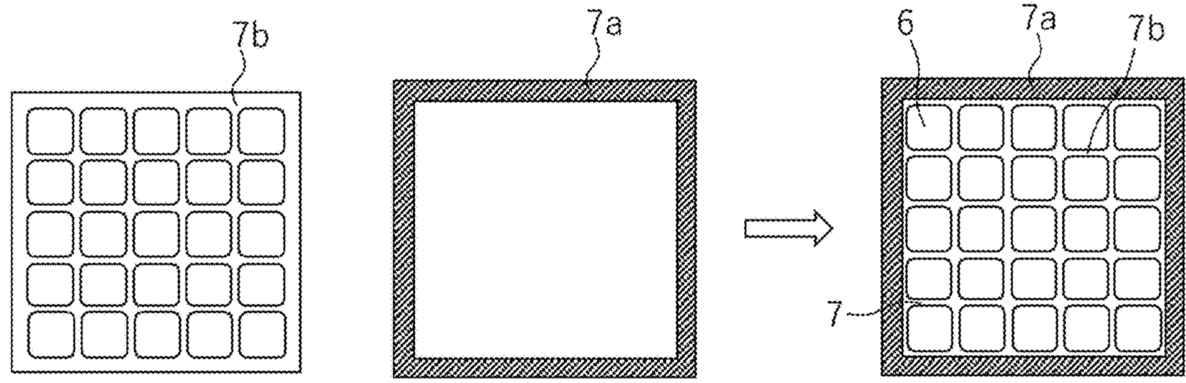

In forming the lattice portion of the workpiece separation body, various materials such as resin (plastic), metal, wood, etc. can be used. The materials are not particularly limited, and these may be used in combination. The frame bodies may be formed of a material having a certain degree of rigidity, such as resin or metal, and within the frame bodies, the connecting portions may be formed using metal wires such as conductive wires, synthetic fibers such as nylon threads, wire materials such as ropes, threads, and filaments, as well as resins and tapes. Some of specific examples may include, for example, as follows: as shown in FIG. 5(*a*), a lattice portion 7 which is formed by stretching nylon threads, each having a diameter of about 100 μm, vertically and horizontally between the aluminum frame bodies 7*a* to make the connecting portions 7*b*; and as shown in FIG. 5(*b*), a connecting portion 7*b* made of resin, having opening portions 6, formed of a PET film of a thickness of about 50 μm may be prepared and attached to a frame body 7*a* as described above to form the lattice portion 7.

Figure 6A:
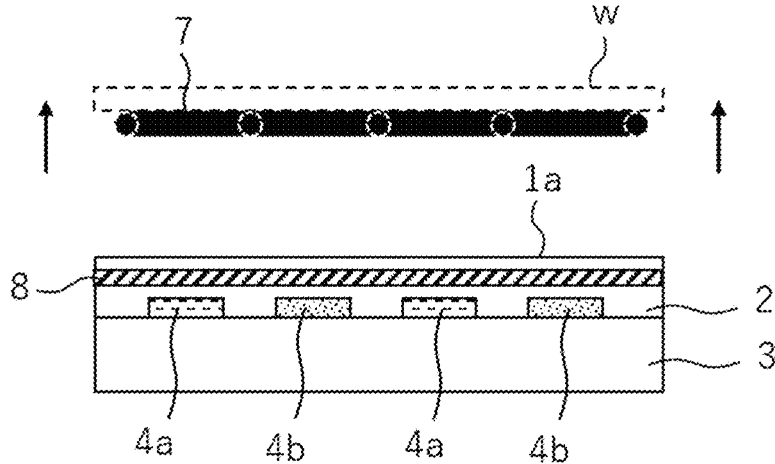
FIG. 6(*a*) and FIG. 6(*b*) are cross-sectional views each for describing an operation of a workpiece separation body in the workpiece attraction device.
Figure 6B:
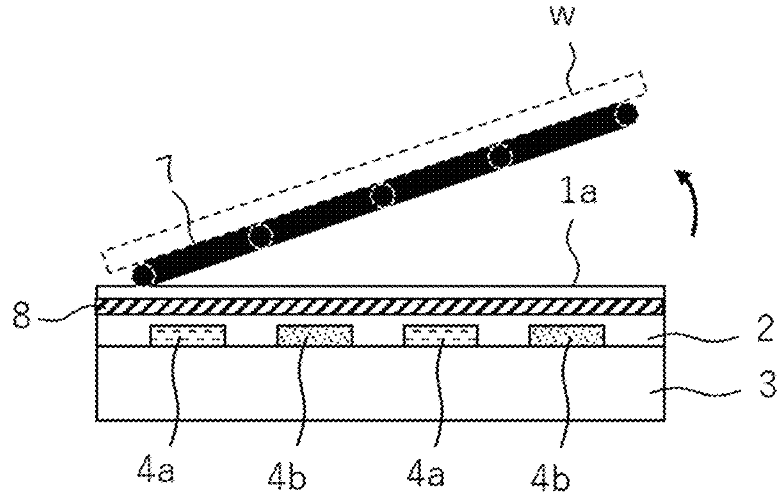

The workpiece separation body is interposed between the attracted workpiece and the electrostatic attraction body, and assists in separating the workpiece from the workpiece attraction surface after the application of voltage to the attraction electrode is stopped. More specifically, when a workpiece is attracted, the workpiece separation body is in close contact with the electrostatic attraction body, as shown in FIGS. 1 to 4. In contrast, in dechucking the workpiece, the workpiece separation body is moved relatively away from the electrostatic attraction body to assist in separation (dechuck) of the workpiece. In this case, for example, as shown in FIG. 6(*a*), a driving device (not shown) such as a motor or an air cylinder may be used to move the whole workpiece separation body 5 away from the workpiece attraction surface 1*a* of the electrostatic attraction body 1 at a certain distance, so that the workpiece w may be separated from the workpiece attraction surface 1*a*. Alternatively, as shown in FIG. 6(*b*), the workpiece separation body 5 may be tilted by a driving device (not shown) with a part thereof (one side thereof) fixed as an axis, so that the workpiece w may be separated from the workpiece attraction surface 1*a*. Thereafter, the workpiece separation body separates from the workpiece, thereby completing the separation of the workpiece.

Figure 7:
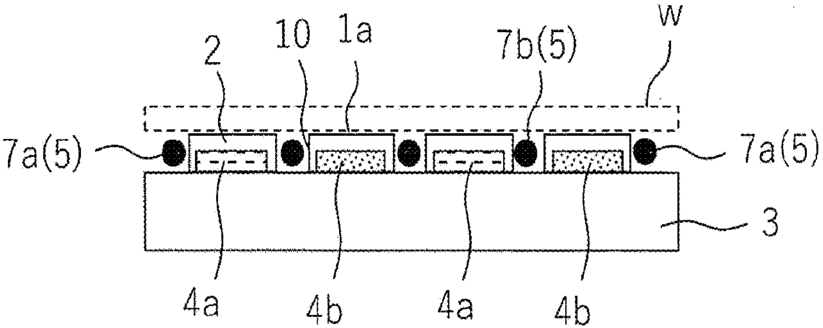
FIG. 7 is a cross-sectional view showing an example of an installation state of a workpiece separation body in the workpiece attraction device.

Alternatively, as shown in FIG. 7, the workpiece separation body 5 may be accommodated in groove portions 10 formed in the gaps between the attraction electrodes 4 of the electrostatic attraction body 1 (the gaps between the attraction electrodes 4*a* and 4*b*) so that workpiece w may be in close contact with the workpiece attraction surface 1*a*. This makes it possible to prevent part of the workpiece attraction force generated by the electrostatic attraction body 1 from being lost (reduced) by the workpiece separation body 5.

The electrostatic attraction body in the present invention may be any one that has an attraction electrode therein and can generate a workpiece attraction force by applying a voltage to the attraction electrode from the outside. For example, a known device can be used in which an attraction electrode is provided between an upper insulation layer and a lower insulation layer, with the upper insulation layer side serving as a workpiece attraction surface. Of these, the upper insulation layer and the lower insulation layer can be formed using, for example, a resin film or a ceramic. The attraction electrode can be formed into a predetermined shape by using a metal foil such as copper or aluminum, forming a film through sputtering or ion plating, etc., etching a metal layer formed by spraying metal material or printing conductive ink, or the like. Of these, an electrostatic attraction body described in WO2020/027246A1 can be suitably used, for an electrostatic attraction body that can generate a strong workpiece attraction force on thin, sheet-shaped workpieces, having high insulation properties, such as paper, cloth, or resin films.

In other words, it is preferable to use a resin film having a volume resistivity of $1\times10^{10}$ to $1\times10^{13}$ Ω·cm for the upper insulation layer. If the volume resistivity is within this range, a sufficient workpiece attraction force can be generated on the workpiece as described above. In particular, if the volume resistivity is less than $1\times10^{10}$ Ω·cm, the attraction force itself for the workpiece is large, but leakage current may occur between the workpiece attraction surface and the workpiece, which causes some damage to the workpiece, such as paper or cloth.

The resin film forming the upper insulation layer preferably has a tensile modulus of elasticity (Young's modulus) of 1 MPa or more and less than 100 MPa. The workpieces to be attracted in the present invention are often relatively thin and soft, as those described above. Although the detailed principle is unclear, the resin film forming the upper insulation layer desirably has a tensile modulus of elasticity (Young's modulus) within the above range to be able to conform to and attract such workpieces. This is also advantageous in cases in which the upper insulation layer is curved to make the workpiece attraction surface curved. Furthermore, from the viewpoints of insulation properties, flexibility, conformability to the workpiece, durability, etc., the thickness of the resin film is preferably 20 to 200 μm.

Examples of such resin films include polyimide, polyethylene terephthalate (PET), nylon, polypropylene, polyurethane, soft polyvinyl chloride, and polyvinylidene chloride. These may be processed by mixing fillers to adjust the properties such as electrical conductivity. Of these, in order to set the volume resistivity and tensile modulus of elasticity within the above-described range, polyurethane and soft polyvinyl chloride are preferable, and soft polyvinyl chloride is more preferable.

The lower insulation layer may be made of the same resin film as described for the upper insulation layer, or may be made of a different insulation material. However, from the viewpoint of preventing the current that should flow between the workpiece and the upper insulation layer through the resin film that forms the upper insulation layer from flowing to the lower insulation layer side, it is preferable to use a lower insulation layer having a volume resistivity equal to or higher than that of the resin film forming the upper insulation layer. In addition, from the viewpoint of ensuring flexibility of the electrostatic attraction body as a whole, it is preferable that the lower insulation layer also has a tensile modulus of elasticity (Young's modulus) similar to that of the resin film forming the upper insulation layer. Furthermore, the thickness of the lower insulation layer is preferably 20 to 200 μm for the same reasons as in the case of the upper insulation layer.

The insulation material for forming the lower insulation layer is not particularly limited. However, the same resin film as that forming the upper insulation layer, or a ceramic such as aluminum nitride or alumina may be used. Of these, preferred examples include polyimide, polyethylene terephthalate (PET), nylon, polypropylene, polyurethane, soft polyvinyl chloride, and polyvinylidene chloride as in the case of the resin film forming the upper insulation layer. These may be processed by mixing fillers to adjust the properties such as electrical conductivity. More preferably, from the viewpoint of setting the volume resistivity and tensile modulus of elasticity within a predetermined range, as in the case of the resin film forming the upper insulation layer, polyurethane or soft polyvinyl chloride is preferable, and soft polyvinyl chloride is even more preferable.

Commonly known types of attraction electrode include bipolar electrode in which voltages of opposite polarity to each other are applied, and monopolar electrode in which a voltage is applied to the attraction electrode while the workpiece side is grounded. In the present invention, any of these can be used. However, since the monopolar electrode requires the workpiece side to be grounded as described above, it is preferable to employ a bipolar attraction electrode. The material for forming the attraction electrode is as described above. The thickness thereof is not particularly limited. However, taking into consideration the possibility of breakage due to deformation of the electrostatic attraction body, and conversely, the possibility of impaired flexibility due to an excessive thickness, the thickness of the attraction electrode is preferably 1 to 20 μm.

Figure 8:
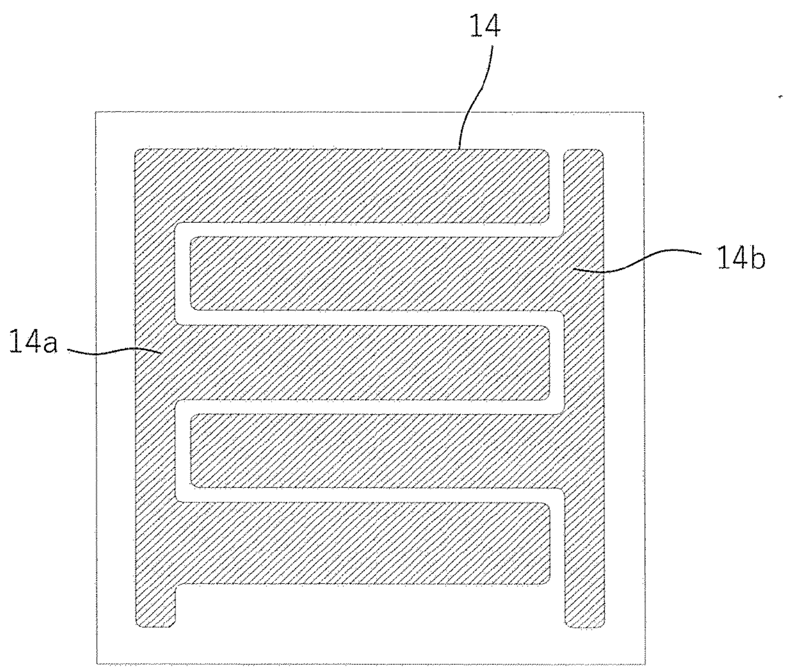
FIG. 8 is a plan view showing an example of an attraction electrode in an electrostatic attraction body of the workpiece attraction device.

Here, examples of the bipolar attraction electrodes include a pair of attraction electrodes having a flat or semicircular shape, as well as a pair of attraction electrodes having a comb-tooth or mesh-like pattern. However, as shown in FIG. 8, it is preferable to use a pair of comb-tooth electrodes 14*a* and 14*b* formed in such a way that the comb-tooth portions thereof are meshed on the same plane while maintaining a constant interval between them. Forming the bipolar attraction electrode 14 using such comb-tooth electrodes 14*a* and 14*b* can generate a strong workpiece attraction force even in the case of a workpiece made of paper, cloth, resin film, or the like. Since these workpieces are insulators, the Coulomb force that is dominant in attracting conductors or semiconductors decreases. However, using a pair of comb-tooth electrodes as described above as the attraction electrode can generate a gradient force between the electrode and the workpiece having insulation properties to obtain a strong attraction force.

When obtaining an electrostatic attraction body by using an upper insulation layer, a lower insulation layer, and an attraction electrode, the attraction electrode should be sandwiched between the upper insulation layer and the lower insulation layer so as not to be exposed. Specifically, for example, while the attraction electrode is positioned between the upper insulation layer and the lower insulation layer, the layers may be integrally formed by thermocompression bonding, or the layers may be integrally formed using a bonding sheet, adhesive, pressure sensitive adhesive, etc. In that case, as described above, the conductive shielding member 8 may be disposed on the electrostatic attraction body 1. For example, the conductive shielding member 8 may be attached to a predetermined position of an upper insulation layer 2 which forms the workpiece attraction surface 1*a*. Alternatively, the upper insulation layer 2 may be formed by a plurality of layers, so that the upper insulation layers 2 are integrated with the attraction electrode 4 and the lower insulation layer 3, with the conductive shielding member 8 being interposed between the upper insulation layers 2.

The method for applying a voltage to the attraction electrode of the electrostatic attraction body is not particularly limited and any known method may be employed. For example, a power supply device can be connected to the attraction electrode via a connection terminal, a switch, or the like. In that case, when attracting a workpiece made of a sheet-shaped insulator such as paper, cloth, or resin film, a power supply device capable of generating a high DC voltage may be suitably used. The potential difference to be generated can be about ±100 to ±5000 V. As necessary, a boost circuit (high voltage generating circuit) may be provided that is capable of boosting the voltage to a predetermined voltage. The polarity of the voltage applied to the bipolar attraction electrode may be switched for each cycle of operation from attracting the workpiece to dechucking it.

The workpieces to be attracted in the workpiece attraction device of the present invention is not particularly limited. The objects to be attracted include semiconductors and conductors, as well as sheet-shaped insulators such as paper, cloth, and resin films as described above, and workpieces such as bundles of fibers. In addition, for sheet-shaped workpieces, a plurality of workpieces may be attracted and handled at once. For example, even if the workpiece is such an insulator that has a volume resistivity of about $1\times10^{12}$ to $1\times10^{14}$ Ω·cm and has a thickness as thin as 2 mm or less, the influence of residual charge can be reduced as much as possible. Therefore, the workpiece can be used as a suitable workpiece in the present invention. In particular, even an extremely thin workpiece having a thickness of about 0.005 to 0.5 mm can be attracted and dechucked.

EXAMPLES

The following is a more specific description of the present invention with reference to examples, but the present invention is not limited to these examples.

Example 1

Production of Test Electrostatic Attraction Body

In this example, a test electrostatic attraction body was produced, and an experiment was carried out to check the change in surface potential (electrification) under various conditions.

Figure 9A:
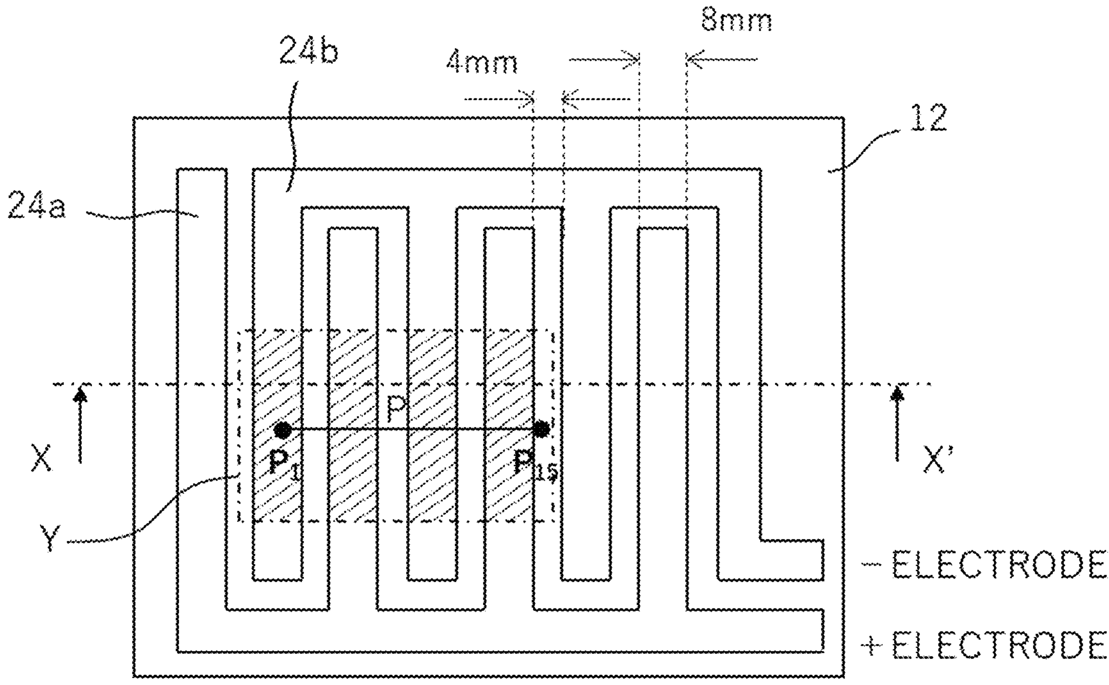
FIG. 9 is a diagram for describing a test electrostatic attraction body used in Example 1, in which FIG. 9(*a*) is a plan view for describing an attraction electrode 24 consisting of comb-tooth electrodes 24*a* and 24*b*, and FIG. 9(*b*) is an X-X' cross-sectional view in FIG. 9(*a*).
Figure 9B:
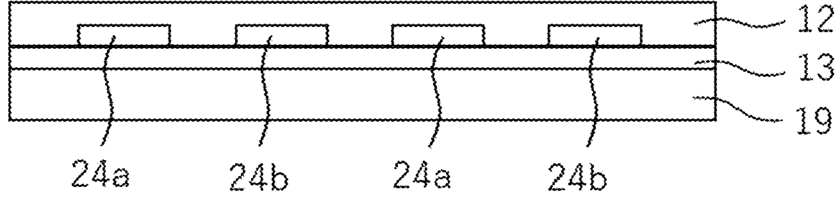

First, to obtain a test electrostatic attraction body, a double-sided film tape was prepared that had a silicone adhesive on both sides of a 25 μm thick polyimide film protected with release paper (film separator), and a copper foil with a thickness of 18 μm was attached to the silicone adhesive on one side of the tape. The double-sided film tape had the following specification. Product name: Double-coated adhesive Kapton (registered trademark) film tape, manufactured by Teraoka Seisakusho Co., Ltd. Next, only the copper foil portion was cut out using a cutting plotter (FC2250-180VC manufactured by Graphtec Corporation) to form an attraction electrode 24 consisting of a pair of comb-tooth electrodes 24*a* and 24*b* as shown in FIG. 9(*a*). At this time, the width (electrode width) of each of the comb-tooth portions of the comb-tooth electrodes 24*a* and 24*b* was 8 mm, and the interval (pitch) between the comb-tooth portions was 4 mm.

Next, a 5 mm thick plastic plate (low foaming PVC plate) was attached as a base material (support material) to the silicone adhesive on the other side of the double-sided film tape. The plastic plate had the following specification. Product name: Graform GF-5, manufactured by Kinugawa Co., Ltd. Furthermore, soft polyvinyl chloride films each having a thickness of 100 μm were laid over the attraction electrode 24 formed on the double-sided film tape so as to cover the attraction electrode 24, and the films were attached together with a laminator and a roller. Each soft polyvinyl chloride film has a volume resistivity of $1\times10^{10}$ Ω·cm and a tensile modulus of elasticity (Young's modulus) of 20 to 30 MPa. The volume resistivity of the soft polyvinyl chloride film at this time was measured by the double-ring electrode method (IEC60093, ASTM D257, JIS K6911, JIS K6271). In this manner, a test electrostatic attraction body measuring 100 mm in length and 125 mm in width was produced that had a polyimide film (lower insulation layer 13), comb-tooth electrodes 24*a* and 24*b* (attraction electrode 24), and a soft polyvinyl chloride film (upper insulation layer) 12 on a plastic plate (base material 19), as shown in FIG. 9(*b*).

Measurement of Surface Potential of Test Electrostatic Attraction Body

A voltage of ±1500 V was applied to the comb-tooth electrodes 24*a* and 24*b* of the test electrostatic attraction body obtained above from a power supply device (not shown), and the surface potential of the soft polyvinyl chloride film corresponding to the workpiece attraction surface was measured. For the surface potential meter, a digital low potential measuring device KSD-3000 manufactured by Kasuga Denki, Inc. was used. The surface potential meter includes a vibration type surface potential sensor with a surface potential measurement area of 20 mm×20 mm at the tip of the probe. The surface potential of the workpiece attraction surface of the target test electrostatic attraction body was measured at a measurement reference distance (height) of 10 mm.

Here, the surface potential of the workpiece attraction surface was measured at 3 mm intervals for the comb-tooth electrodes 24*a* and 24*b* in a direction perpendicularly crossing the longitudinal direction of the comb-tooth portions. Specifically, for four comb-tooth portions in a region Y enclosed by a dashed-dotted line in FIG. 9(*a*), the surface potential was measured at measurement points spaced 3 mm apart on a straight line P starting at $P_1$ and ending at $P_{15}$. As a result, the comb-tooth portions of the negative comb-tooth electrode 24*b* and the comb-tooth portions of the positive comb-tooth electrode 24*a* are arranged alternately on a straight line P, with $P_1$ corresponding to the center of the electrode width of the comb-tooth portion of the comb-tooth electrode 24*b*. In addition, in the measurement, the surface potential was measured three times at one measurement point, and the average value was calculated.

Figure 10:
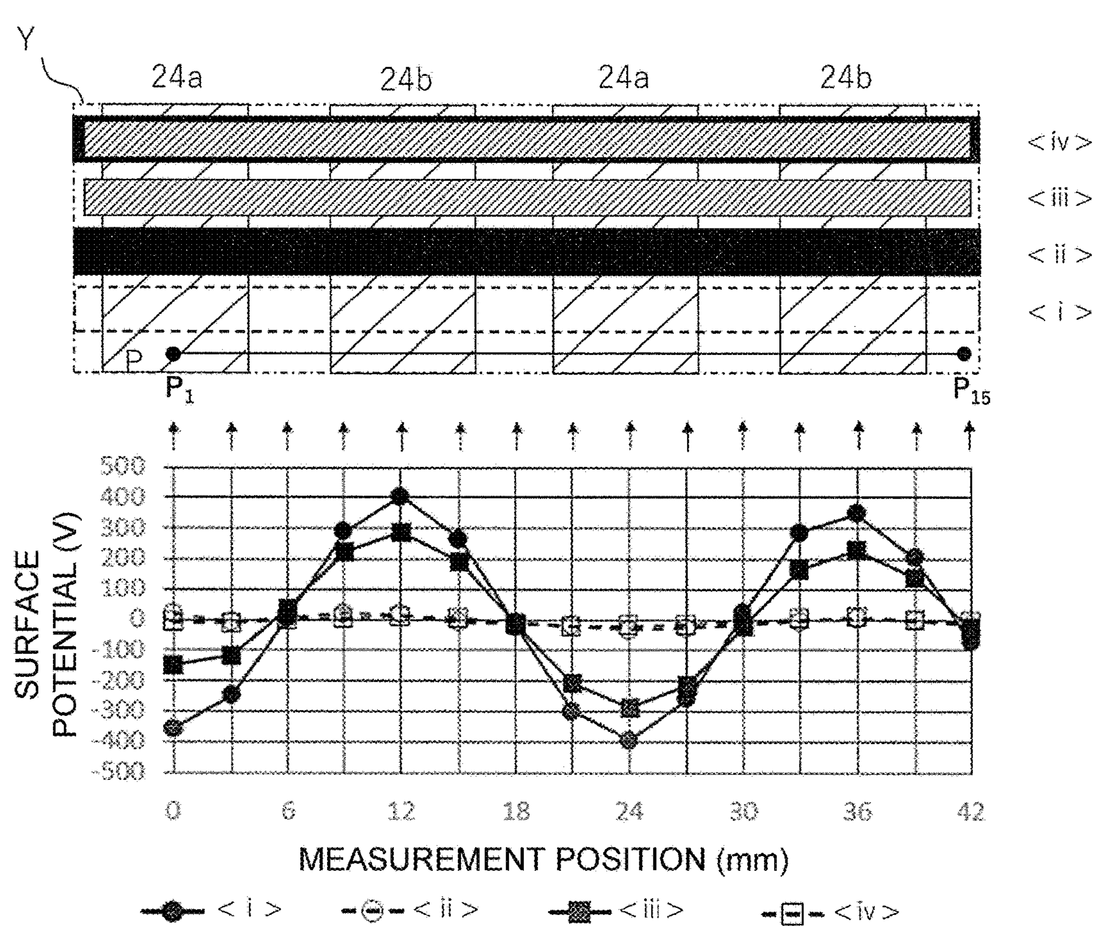
FIG. 10 shows results of measuring surface potentials of the test electrostatic attraction body of Example 1.

The surface potential was measured along the straight line P, for the following four cases: <i> a case of measuring the surface potential of the workpiece attraction surface of the test electrostatic attraction body being as it is; <ii> a case of measuring the surface potential with a piece of aluminum foil, measuring 25 mm wide×100 mm long×20 μm thick, placed on the workpiece attraction surface; <iii> a case of measuring the surface potential with a polyester cloth (virtual workpiece), measuring 22 mm wide×90 mm long, placed on the workpiece attraction surface; and <iv> a case of measuring the surface potential with the above-described aluminum foil placed on the workpiece attraction surface and with the above-described polyester cloth placed on top of the aluminum foil. The result is shown in FIG. 10. Note that when the aluminum foil was placed, it was connected to an earth.

The results in FIG. 10 <i> show that on the workpiece attraction surface of the test electrostatic attraction body, the surface potential is highest at the widthwise center of the comb-tooth portion of each of the comb-tooth electrodes 24*a* and 24*b*, and is smallest (zero) at the center of each gap between adjacent comb-tooth portions. The same was true for the surface potential of polyester cloth in the case of (iii). In contrast, in the case of <ii>, on the surface of the aluminum foil simulating the conductive shielding member, the surface potential did not increase even at the comb-tooth portions of the comb-tooth electrodes 24*a* and 24*b* and remained nearly zero. The same was true for the surface potential of the polyester cloth placed on the aluminum foil in the case of <iv>.

From these results, it can be said that: the surface potential does not increase even when a voltage is applied to the attraction electrodes, in the gaps between adjacent attraction electrodes or in places having a conductive shielding member such as aluminum foil; and therefore it is possible to prevent the workpiece or workpiece separation body from electrification in such positions.

Example 2

In this example, a test electrostatic attraction body was produced so as to have the aluminum foil, which was placed on the workpiece attraction surface in the previous example 1, embedded inside the electrostatic attraction body. In other words, a piece of aluminum foil having a width of 25 mm, a length of 100 mm, and a thickness of 20 μm was placed on the soft polyvinyl chloride film of the test electrostatic attraction body prepared in Example 1; the same soft polyvinyl chloride film having a thickness of 100 μm as that used in Example 1 was further laminated; and the resultant was attached together with a laminator and a roller. At this time, the aluminum foil was placed in a direction perpendicularly crossing the longitudinal direction of the comb-tooth portions of the comb-tooth electrodes 24*a* and 24*b*. In this manner, a test electrostatic attraction body was produced, which had the above-described aluminum foil corresponding to the conductive shielding member, between two soft polyvinyl chloride films forming the upper insulation layer. This aluminum foil was also connected to an earth.

The surface potential of the test electrostatic attraction body obtained in this manner was measured in the same manner as in Example 1, with the portion having the aluminum foil included in region Y. At that time, the surface potential was measured along the straight line P, for the following two cases: <v> a case of measuring the surface potential of the workpiece attraction surface in a portion that does not have aluminum foil; and <vi> a case of measuring the surface potential of the workpiece attraction surface in a portion that has aluminum foil. The result is shown in FIG. 11.

Figure 11:
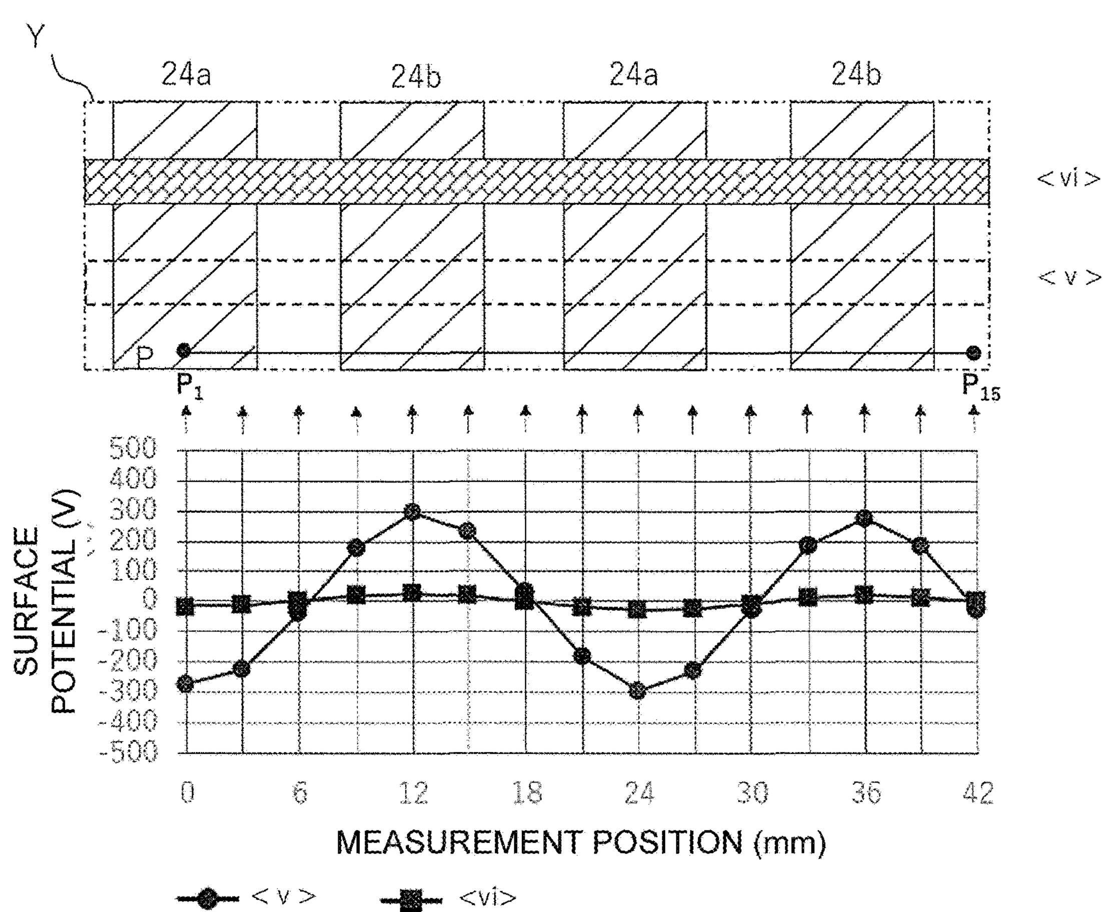
FIG. 11 shows results of measuring surface potentials of a test electrostatic attraction body of Example 2.

As can be seen from FIG. 11, in the case of <v>, the surface potential is highest at the widthwise center of the comb-tooth portion of each of comb-tooth electrodes 24*a* and 24*b*, and is smallest at the center of each gap between the adjacent comb-tooth portions. In contrast, in the case of <vi>, the surface potential did not increase even at the comb-tooth portions of the comb-tooth electrodes 24*a* and 24*b*, and remained at a value close to zero, showing the same results as in Example 1.

As described above, the workpiece attraction device according to the present invention can prevent dielectric polarization and electrostatic induction of the workpiece separation body when attracting the workpiece. This makes it possible to dechuck (separate) the attracted workpiece in a short time and reliably. In particular, the present invention can eliminate the influence of residual charge on the workpiece or the workpiece separation body as much as possible. Therefore, the present invention can be used suitably when thin workpieces such as paper, cloth, and resin films are transported. Furthermore, a versatile workpiece attraction device can be provided that is less susceptible to the influence of the type and shape of the workpiece or to the surrounding environment such as humidity.

REFERENCE SIGNS LIST

1: electrostatic attraction body, 1*a*: workpiece attraction surface, 2, 12: upper insulation layer, 3, 13: lower insulation layer, 4: attraction electrode, 4*a*, 4*b*, 14*a*, 14*b*, 24*a*, 24*b*: (bipolar) attraction electrode, 5: workpiece separation body, 6: opening portion, 7: lattice portion, 7*a*: frame body, 7*b*, 7*b*': connecting portion, 8: conductive shielding member, 9, 19: support material, 10: groove portion.

The invention claimed is:

1. A workpiece attraction device, comprising:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, and in a plan view from a workpiece side with a workpiece attracted, the attraction electrode of the electrostatic attraction body does not face the lattice portion of the workpiece separation body.

2. The workpiece attraction device according to claim 1, wherein the lattice portion of the workpiece separation body is disposed so as to surround the attraction electrode of the electrostatic attraction body, and in a plan view from a workpiece side with a workpiece attracted, the attraction electrode of the electrostatic attraction body does not face the lattice portion of the workpiece separation body.

3. A workpiece attraction device, comprising:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, and a conductive shielding member is interposed between the lattice portion of the workpiece separation body and the attraction electrode of the electrostatic attraction body.

4. The workpiece attraction device according to claim 3, wherein the conductive shielding member is disposed on the electrostatic attraction body.

5. The workpiece attraction device according to claim 4, wherein the conductive shielding member is connected to an earth.

6. The workpiece attraction device according to claim 3, wherein the conductive shielding member is connected to an earth.

7. A workpiece attraction device, comprising:

an electrostatic attraction body having an attraction electrode therein and a workpiece attraction surface capable of attracting a workpiece thereto by applying a voltage to the attraction electrode to generate a workpiece attraction force; and a workpiece separation body that is interposed between an attracted workpiece and the electrostatic attraction body, and assists in separating the workpiece from the workpiece attraction surface after application of voltage to the attraction electrode is stopped, wherein the workpiece separation body has a plurality of opening portions for applying the workpiece attraction force, generated on the workpiece attraction surface, toward a workpiece, and the workpiece separation body is partitioned into the opening portions by a lattice portion so that the opening portions are substantially uniformly present within a plane of the workpiece separation body, in a plan view from a workpiece side with a workpiece attracted, the attraction electrode of the electrostatic attraction body does not face the lattice portion of the workpiece separation body, and a conductive shielding member is interposed between the lattice portion of the workpiece separation body and the attraction electrode of the electrostatic attraction body.

8. The workpiece attraction device according to claim 7, wherein the conductive shielding member is connected to an earth.

* * * * *